US006968302B1

(12) United States Patent
Ahrens et al.

(10) Patent No.: US 6,968,302 B1
(45) Date of Patent: Nov. 22, 2005

(54) SYSTEM AND METHOD FOR REMOTE ANALYSIS AND CONTROL OF TEST AND MEASUREMENT DEVICES

(75) Inventors: Mark Lee Ahrens, Parker, CO (US); Steven Robert Ashby, Highlands Ranch, CO (US); David Mark Gaspari, Aurora, CO (US); Larry James Osborn, Colorado Springs, CO (US); Orlando Joseph Gonzalez, Englewood, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/372,667

(22) Filed: Aug. 11, 1999

(51) Int. Cl.[7] .......................... G06F 17/50; G01R 31/02
(52) U.S. Cl. ........................................ 703/13; 324/755
(58) Field of Search ........................... 703/13; 324/755

(56) References Cited

U.S. PATENT DOCUMENTS

| | | | | |
|---|---|---|---|---|
| 5,504,432 A | * | 4/1996 | Chandler et al. | 324/537 |
| 5,504,801 A | * | 4/1996 | Moser et al. | 379/29.01 |
| 5,619,183 A | * | 4/1997 | Ziegra et al. | 340/505 |
| 5,969,835 A | * | 10/1999 | Kamieniecki et al. | 359/110 |
| 6,618,854 B1 | * | 9/2003 | Mann | 717/124 |

* cited by examiner

Primary Examiner—Hugh Jones

(57) ABSTRACT

A system and method for remote analysis and control of test and measurement devices for diagnosis and troubleshooting problems for users of the test and measurement devices. The remote analysis and control tool kit includes a processing device with a modem that is connected to a video camera. The video camera provides video images through the processing device back through the modem so that the remote analysis and control tool kit may transmit video across a network to a call center systems engineer. The remote analysis and control tool kit also includes control software that enables a systems engineer to provide control instructions to the test and measurement device and the system under test, and request status data from both the test and measurement device and the system under test.

13 Claims, 7 Drawing Sheets

SYSTEM AND METHOD FOR REMOTE ANALYSIS AND CONTROL OF TEST AND MEASUREMENT DEVICES

BACKGROUND OF THE INVENTION

1. Field of the Invention

The present invention generally relates to a system and method for providing remote control of test and measurement devices and devices under test. Specifically, the system and method of the present invention provide for a system and method engineered to access a customer test and measurement device and devices under test for determining proper hookup and to perform remote testing.

2. Description of Related Art

As is known in the electrical arts, when a new electrical device is developed or being utilized, the system can exhibit errors. As a consequence, developers and users of these new electrical devices can utilize many techniques to check for proper functioning of the electronic device and diagnose these errors. One of the test and measurement devices that developers use to debug electronics is a logic analyzer. The use of test and measurement devices has never been easy for most users. One of the most difficult tasks when using a test and measurement device has been connecting the test and measurement device to the device under test correctly. Many test and measurement device vendors attempt to rectify this issue by providing accessories that simplify the task of connecting the test and measurement devices to the device under test. This device is usually called an "analysis probe."

Analysis probes usually connect to the device under test or test system with one connection that probes all desired signals at once. The user then connects a few adapter cables to the test and measurement devices, rather than numerous individual probes.

However, the use of an analysis probe is not always successful and the developers and users of an electronic device will still have problems connecting test and measurement devices to the device under test. In these cases, many developers and users resort to contacting the vendor of the test and measurement devices requesting help in connecting the test and measurement device to the device under test.

Some drawbacks with a developer/user communicating with a vendor systems engineer regarding the test and measurement device connections to the system under test include, 1) whether or not the system under test has been properly identified, and 2) whether the connections between the test and measurement device and the device under test have been properly established at the correct electrical junction points.

Heretofore, system developers have lacked a system and method for diagnosing and troubleshooting problems experienced by users of test and measurement devices.

SUMMARY OF THE INVENTION

The present invention is generally directed to a system and method for remote support for diagnosis and troubleshooting problems for users of test and measurement devices.

Briefly described, in architecture the remote analysis and control system can be implemented as follows. A remote analysis and control tool kit is shipped to the test and measurement device user. The remote analysis and control tool kit includes a processing device with a modem that is connected to a video camera. The video camera provides video images through the processing device and the modem so that the remote analysis and control tool kit may transmit video across a network to a systems engineer located at a vendor call center. The remote analysis and control tool kit also includes control software that enables a systems engineer to provide control instructions to the test and measurement device and the system under test, and request status data from both the test and measurement device and the system under test.

The present invention can also be viewed as a method for remote analysis of test and measurement equipment. In this regard, the method can be broadly summarized by the following steps: connecting the remote analysis and control tool kit to the test and measurement equipment, directing a video camera on the test and measurement equipment connections to the device under test, connecting a communication link to the remote analysis tool kit, and powering up the remote analysis and control tool kit. The remote analysis and control tool kit, upon power-up, automatically calls the call center on the connected communication link. The remote analysis and control tool kit establishes the make and model of the connected test and measurement equipment. This make and model information is then transmitted to the call center for analysis and remote system control. This information is used to identify the device display to be used at the call center machine. The call center, through a computer, initializes a remote controller to control said remote controlling device using said model information. The call center, through a computer, can control the test and measurement equipment by submitting instructions to the remote analysis and control tool kit that then can forward those instructions to the test and measurement equipment and device under test.

Other features and advantages of the present invention will become apparent to one with skill in the art upon examination of the following drawings and detailed description. It is intended that all such additional features and advantages be included herein within the scope of the present invention.

BRIEF DESCRIPTION OF THE DRAWINGS

The accompanying drawings incorporated in and forming a part of the specification illustrate several aspects of the present invention, and together with the description, serve to explain the principles of the invention. In the drawings.

DETAILED DESCRIPTION OF THE PREFERRED EMBODIMENT

Figure 1:
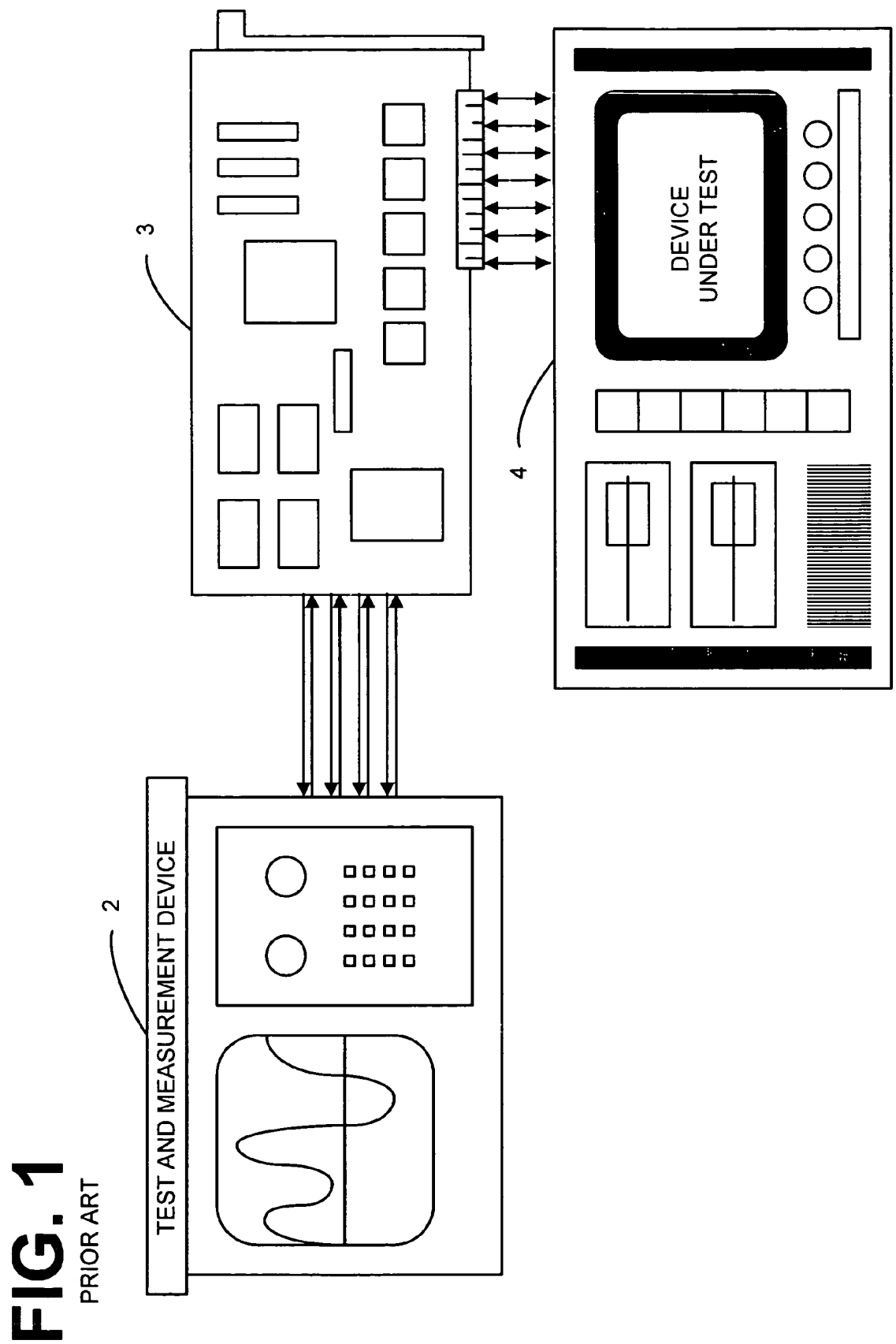
FIG. 1 is a block diagram showing a prior art test set-up including a test and measurement device connected to the analysis probe, which is further connected to the device under test.

The invention will now be described with reference to the drawings, wherein like reference numerals designate corresponding parts throughout the several views. Although the invention will be described in connection with these drawings, there is no intent to limit it to the embodiment or embodiments disclosed therein. On the contrary, the intent is to include all alternatives, modifications, and equivalents included within the spirit and scope of the invention as defined by the appended claims.

Illustrated in FIG. 1 is the logic analysis system of the prior art. A conventional test and measurement device 2 and a conventional device under test 4 each generally comprise a processor (not shown) and a memory (not shown) which can be either one or a combination of the common types of memory, for example, but not limited to, erasable programmable read only memory (EPROM), electronically erasable programmable read only memory (EEPROM), flash memory, programmable read only memory (PROM), random access memory (RAM), read only memory (ROM), flash memory, Dynamic random access memory (DRAM), Static random access memory (SRAM), system memory, or nonvolatile memory such as disk drives, tape drives, compact disc read only memory (CD-ROM) drives, cartridges, or cassettes, etc, with an operating system (not shown). The processor accepts program code (not shown) and data (not shown) from memory over a local interface, i.e., one or more buses (not shown). Using one or more input devices, for example, a mouse (not shown) and a keyboard (not shown), can signal direction from the user. The actions input and result output are displayed on the display terminal (not shown).

The analysis probe 3 connects to the test and measurement device 2 and to the device under test 4 to provide data for state and timing analysis, as is known in the art. The device under test 4 can be any type of computer system that contains a processing, control, or logic device. Examples are a microprocessor, central processing unit (CPU), programmable gate array, programmable logic, etc.

Also shown in FIG. 1, as bi-directional connections, are the connections between the test and measurement device 2, analysis probe 3, and the device under test 4. These connections can be any type of connection, for example but not limited to, serial, parallel, optical, or other suitable connections.

The combination of the analysis probe 3 and the test and measurement device 2, permits the user to both control and trace processor activity on a device under test 4. The analysis probe 3 supplies signals from the target processor (not shown) to the test and measurement device 2. There are configuration files set up in the test and measurement device 2 to properly interpret the device under test processor signals.

Figure 2:
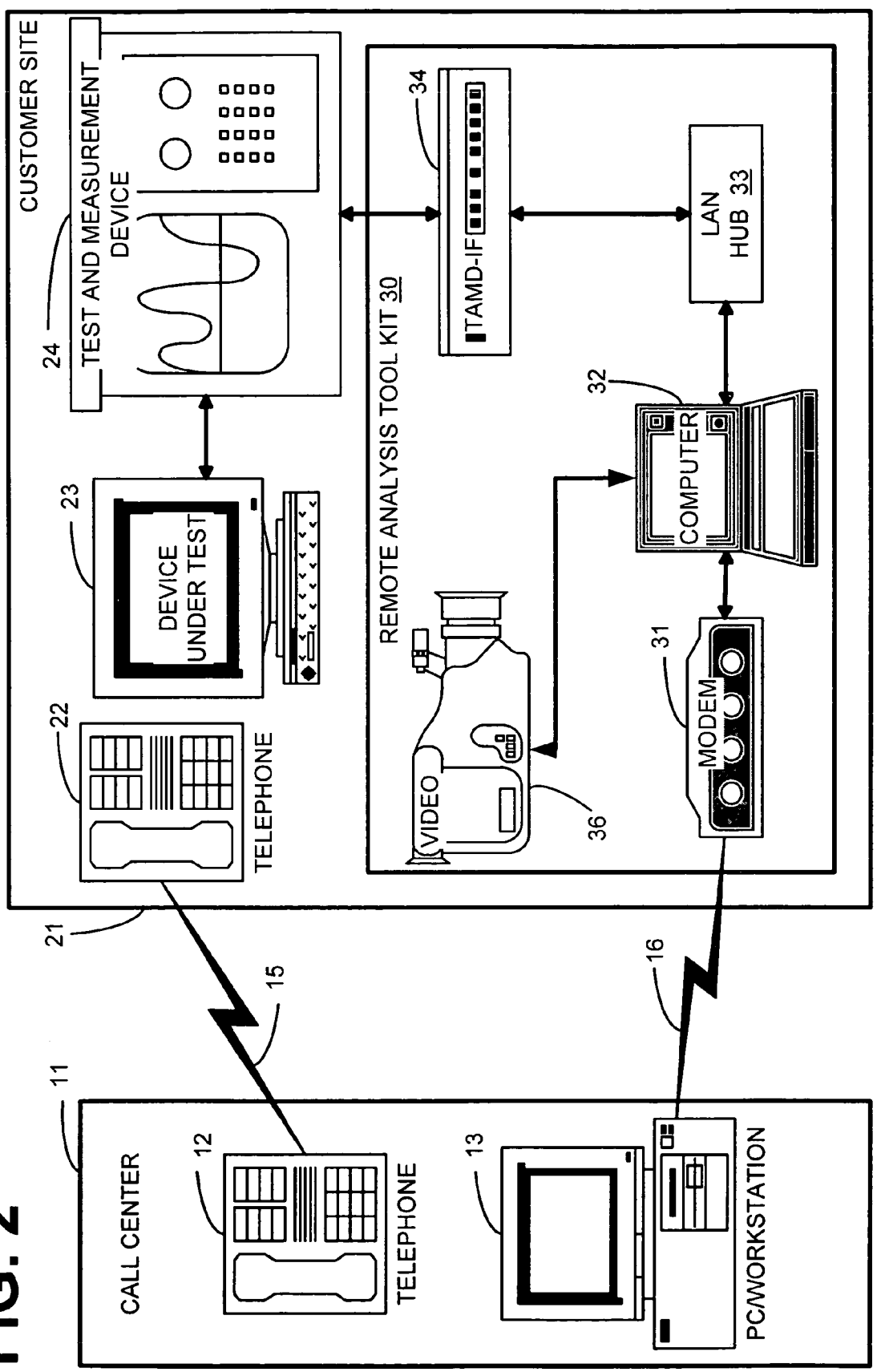
FIG. 2 is a block diagram illustrating the remote analysis and control system of the present invention, including the connections from the call center to the remote analysis and control tool kit, which is further connected to the test and measurement equipment and the device under test.

FIG. 2 is the block diagram of an example of a remote analysis and control system utilizing the remote analysis and control tool kit 30 of the present invention. The call center 11 contains numerous telephones 12 that allow a systems engineer at the call center 11 to communicate verbally over the telephone 12 with a user at a customer site 21. The call center 11 also contains PC/workstations 13 that allow a systems engineer at the call center 11 to communicate with the test and measurement device 24 at the customer site 21.

The PC/workstation 13 at the call center 11 is connected to a modem 31 at the customer site 21. The modem 31 is contained within the remote analysis and control tool kit 30 and may be either a stand-alone modem or a modem card within the computer 32. The modem 31 is connected to the call center 11 across a standard network 16. The inventors contemplate that network 16 could be a PSTN, ISDN, Internet, or some other type of wide area or local area network.

The computer 32 is further connected to a video camera 36 and a local area network (lan) hub 33. The lan hub 33 is also connected to the test and measurement device interface 34 and other connected test equipment, PC, or other networkable devices.

The test and measurement device interface 34 is connected to the test and measurement device 24 at the customer site. A test and measurement device can include an oscilloscope or logic analyzer. The test and measurement device 24 is further connected to a device under test 23. In this manner the systems engineer at the call center 11 may utilize the remote analysis and control tool kit 30 including the video camera 36 to view the connections between the test and measurement equipment 24 and the device under test 23. The systems engineer at the call center 11 may further be in verbal contact with a user through the use of a telephone 12 across a network 15 to a telephone 22 at the customer site 21.

Figure 3:
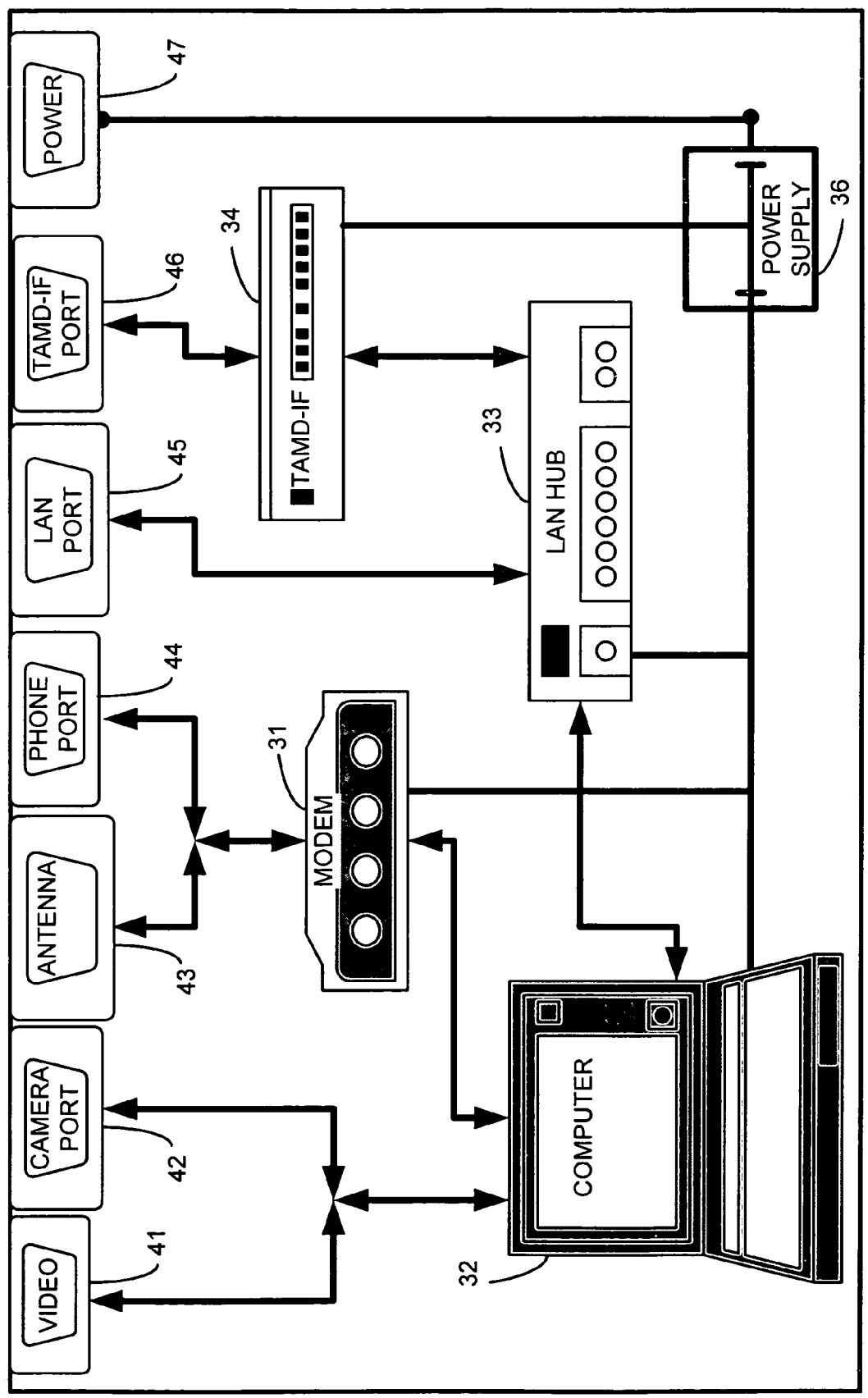
FIG. 3 is a block diagram illustrating the flow of data between the computer, modem, lan hub, test and measurement equipment interface and the ports connecting each of these devices to equipment outside the remote analysis and control tool kit.

Illustrated in FIG. 3 is a block diagram illustrating the devices within the remote analysis and control tool kit 30 and their connections to the equipment outside the remote analysis and control tool kit 30. The remote analysis and control tool kit 30 includes a computer 32 that is connected to a video port 41 and camera port 42. The computer 32 is also connected to the modem 31 that has dual connection to a global system for mobile communications (GSM) cell phone antenna port 43 or a standard PSTN phone port 44. The computer 32 is further connected to a lan hub 33 as defined above. The lan hub is connected to a lan port 45 and to a test and measurement device interface (TAMD-IF) 34. The inventors prefer that an IEEE 488 bridge will permit a high-speed connection directly to the test and measurement equipment 24 (FIG. 2), however the inventors contemplate other high-speed connections would be operable. This high-speed connection from the test and measurement interface device (TAMD-IF) 34 is through the TAMD-IF port 46.

Power is provided to the remote analysis and control tool kit 30 through a power port 47 that is further connected to a power supply 36 that provides power to the computer device 32, the modem 31, the lan hub 33, and the test and measurement interface 34.

Figure 4:
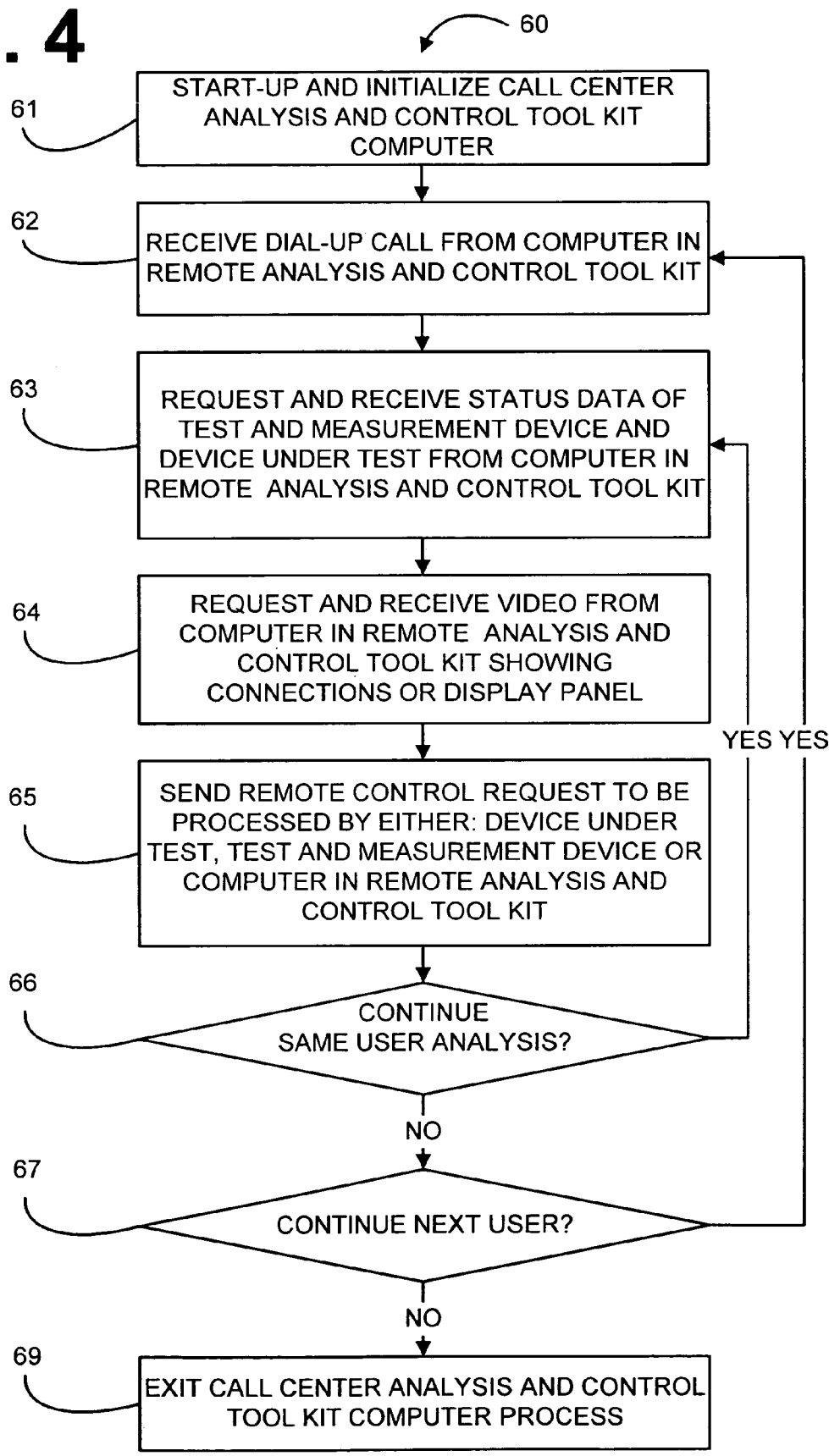
FIG. 4 is a flow chart of the method for performing the remote analysis and control process at the call center for the remote analysis and control tool kit system of the present invention.

Illustrated in FIG. 4 is a flow chart of a possible implementation of the call center remote analysis and control method 60 of the present invention. In block 61, the PC/workstation 13 at the call center is initialized at step 61. This start-up and initialization step is generally performed at the start of the day and allows the PC/workstation 13 at the call center to accept connections to various remote analysis and control tool kits 30 throughout the day.

The PC/workstation 13 located at the call center remote analysis and control method 60 PC/workstation 13 next receives a dial-up call from the computer 32 in the remote analysis and control tool kit 30 at step 62. At step 63, the PC/workstation 13 at the call center requests and receives the status data of the test and measurement device 24 and the device under test 23 from the computer 32 in the remote analysis and control tool kit 30. All of the measurements are conducted through the instrument graphical user interface (GUI) on the computer 13 at the call center.

Next, at step 64, the systems engineer at the call center 11 can request and receive a video feed from the video camera 36 located at the remote analysis and control tool kit 30. The video feed illustrates the transmission of data possible under the connections between the test and measurement device 24 and the device under test 23, what may include a view of the display panel of the test and measurement equipment 24. The system engineer at the call center 11 may then initiate commands on the call center at step 65. These commands are sent from computer 13 to be processed by either the device under test 23, the test and measurement device 24, or the computer 32 within the remote analysis and control tool kit 30.

At step 66, the PC/workstation 13 at the call center then determines if analysis is to continue with the same device at step 66. If anaysis of this device is to continue, the PC/workstation 13, at the call center, returns to step 63 to request and receive current status data from the test and measurement device 24, device under test 23, or the computer in the remote analysis tool kit 30.

If the system engineer decides that no further analysis need be performed at the same customer site 21, the PC/workstation 13 at the call center checks if there are more customer sites waiting to be connected to the call center at step 67. If the PC/workstation 13 at the call center, is to continue with the next user, the PC/workstation 13 returns to step 62 and waits to receive the next dial-up call from a computer 32 in a remote analysis and control tool kit 30 at a different customer site 21. If the PC/workstation 13 at the call center is not to continue to the next user, the call center's tool kit PC/workstation 13 exits at step 69.

Figure 5:
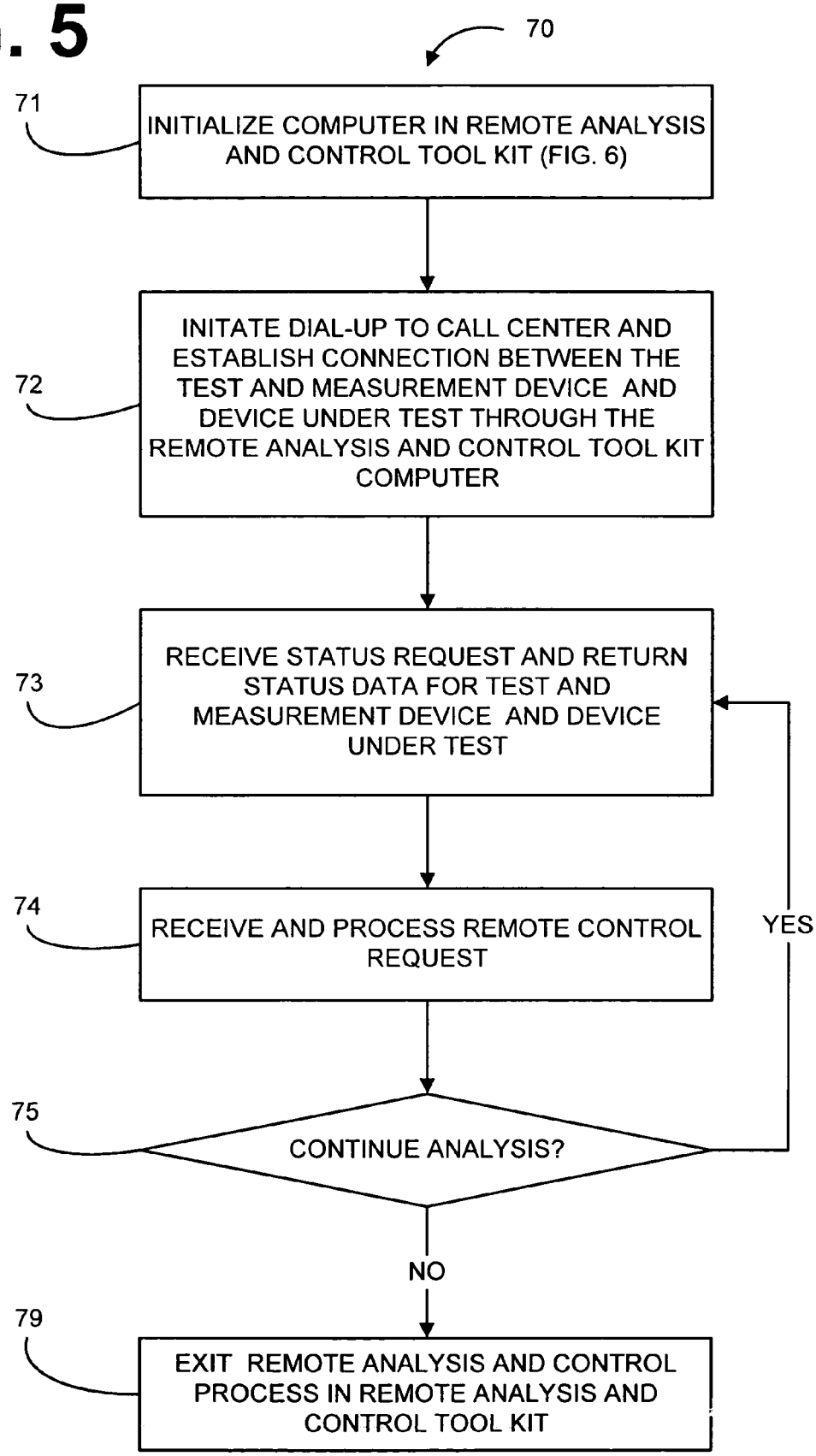
FIG. 5 is a flow chart of the method for performing the remote analysis and control process at the user site utilizing the remote analysis and control tool kit as show in FIGS. 2 and 3.

FIG. 5 is a flowchart of a possible implementation of the remote analysis and control process 70. This possible implementation provides remote analysis and control, from a call center 11, of a test and measurement device 24 or device under test 23 at a remote customer site 21. First, the remote analysis and control process 70 starts up and initializes computer 23 within the remote analysis and control tool kit 30. This start-up and initialization process of the remote analysis and control process 70 is herein defined in further detail with regard to FIG. 6.

The remote analysis and control process 70 initiates a dial-up call to the call center 11 and establishes a connection between the device under test 23 and the test and measurement device 24 through the remote analysis and control tool kit 30 at step 72. The remote analysis and control process 70 receives a status request from PC/workstation 13 at the call center at step 73. The computer 32 located within the remote analysis and control tool kit 30 acquires the status data from the test and measurement device 24 and the device under test 23, and returns at status data to the PC/workstation 13 at the call center 11.

The remote analysis and control process 70 receives a request to perform a remote control function at step 74. The computer 32 within the remote analysis and control tool kit 30 performs the requested function or instructs the test and measurement device 24 and/or device under test 23 to perform the requested function.

At step 75, the analysis and control process 70 determines whether the remote analysis and control process 70 is to continue. If the remote analysis and control process 70 is to continue, it returns to step 73 to receive the next request for status data. If the remote analysis and control process 70 is not to be continued, the remote analysis and control process 70 exits processing on computer 32 at step 79.

Figure 6:
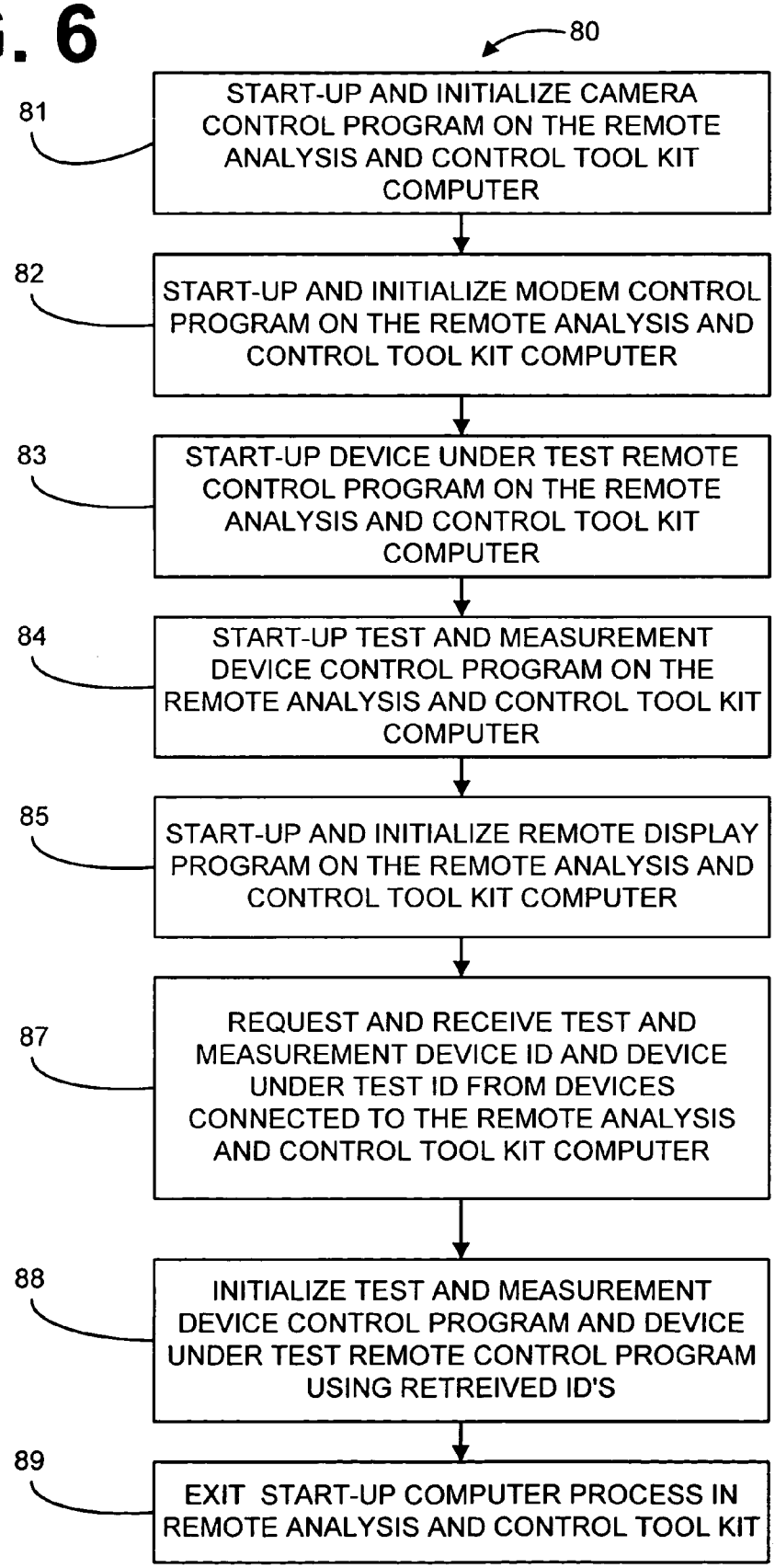
FIG. 6 is a flow chart of the start-up process that initializes the computer of the remote analysis and control tool kit, as shown in FIGS. 2 and 3.

Illustrated in FIG. 6 is a flow chart of a possible implementation of an initialization process of the computer 32 within the remote analysis and control tool kit 30. A possible initialization process example has ViCAM to initialize the camera initialization process 80 within the computer 32 within the remote analysis and control tool kit 30 first initializes the camera control program at step 81. The camera control program may be, for example, but not limited to, ViCAM to operate the camera.

At step 82, the remote analysis and control tool kit computer 32 initializes the modem control program that interacts with modem 31 within the remote analysis and control tool kit 30. The modem control program may be, for example, but not limited to, CarbonCopy, PC Anywhere, IE40 or Netscape. This will start the communication back to the PC/workstation at the call center 11.

The computer 32 in the remote analysis and control tool kit 30 starts up the remote computer control program at step 83. The remote computer control program may be, for example, but not limited to, Exceed, CarbonCopy, IE40 or Netscape to control the instrument connected to the device under test 23. The computer 32 next initializes the target test device control program at step 84, and initializes a remote display program at step 85.

At step 87, the computer 32 requests identification numbers from the test and measurement device 24 and device under test 23. The identification numbers of the test and measurement device 24 and device under test 23 are then transferred to the computer 32 within the remote analysis test kit 30 at step 87. The transmission of request and response data is accomplished via the instrument connection and the instrument GUI running through Exceed, Carbon Copy, IE40 or Netscape to that remote analysis and control tool kit 30. This response data is then sent through the modem 31 vto the call center PC/workstation 13 through the same software application (i.e. if it's Carbon Copy on the remote toolkit it would be Carbon Copy on the call center computer).

The test and measurement device control program and remote computer control programs are then initialized using the retrieved IDs at step 88. The startup process 80 then exits at step 89.

Figure 7:
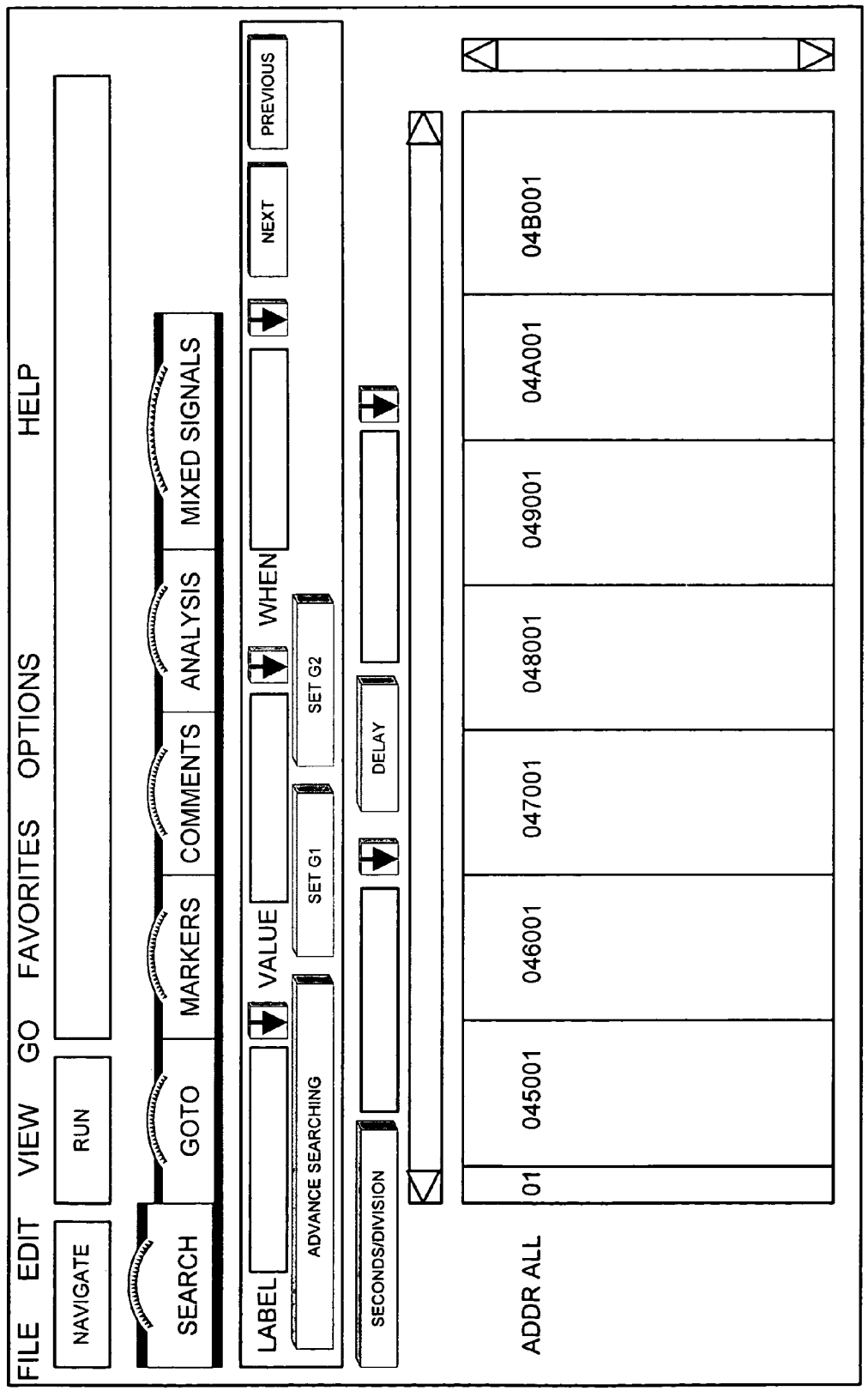
FIG. 7 is a block diagram illustrating the remote analysis and control process graphical user interface for controlling the users test and measurement equipment and device under test remotely from the call center utilizing the remote analysis and control tool kit of the present invention.

FIG. 7 is a block diagram of an example of an interface screen executing on the call center PC/workstation 13 that permits control of computer 32 within the remote analysis and control tool kit 30, the test and measurement device 24, and the target test device 23. This state-listing window is one of many possible windows that may be displayed of a logic analyzer. This window allows systems engineers or the user to select the measurement of interest in the frame (i.e., scope, lan card, pattern generator, or emulation module). This will in turn allow systems engineers or the user to configure the card for the specific measurement. The "run" button allows systems engineers or the user to start the measurement. The listing at the bottom of the figure allows systems engineers or the user to examine the processor assembly code that was executed on the processor or examine the bus transaction for a given protocol.

The "search" button allows a systems engineer to quickly look through the listing looking for elements of interest. The "go to" button is a way for a systems engineer to find a particular state within the listing. The "markers" button allows a systems engineer to set markers within the assembly listing and quickly correlate data points across multiple instruments within the same time domain. The "lister" button window to analyze the processor actual execution verses the customer desired execution of the program. This is where a systems engineer would find most of the bugs either timing related or execution related.

The remote analysis and control system 70, comprises an ordered listing of executable instructions for implementing logical functions, that can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device.

The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CD-ROM) (optical).

Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

The foregoing description has been presented for purposes of illustration and description. It is not intended to be exhaustive or to limit the invention to the precise forms disclosed. Obvious modifications or variations are possible in light of the above teachings.

The embodiment or embodiments discussed were chosen and described to provide the best illustration of the principles of the invention and its practical application to enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method comprising:
    providing a computer located at a customer test site, the customer test site having a logic analyzer coupled to a device under test via a connection;
    communicatively coupling the computer to the logic analyzer;
    providing a remotely-located call center establishing a communication session with the computer over a standard telephone connection, thereby allowing computer-controlled analysis of the device under test from the call center through the computer and the logic analyzer over the standard telephone connection;
    directing a video camera on the connection, thereby producing a video image of the connection; and
    transmitting the video image to the remotely-located call center over the standard telephone connection thereby allowing the video image of the connection to be viewed at the remotely-located call center over the standard telephone connection.

2. A method as in claim 1, further comprising:
    when the transmitted video image as viewed at the call center indicates that the connection is improper, telephoning from the call center to the customer site to fix the improper connection.

3. An apparatus comprising:
    means for providing a computer located at a customer test site, the customer test site having a logic analyzer coupled to a device under test via a connection;
    means for communicatively coupling the computer to the logic analyzer;
    means for providing a remotely-located call center establishing a communication session with the computer over a standard telephone connection, thereby allowing computer-controlled analysis of the device under test from the call center through the computer and the logic analyzer over the standard telephone connection;
    means for directing a video camera on the connection, thereby producing a video image of the connection; and
    means for transmitting the video image to the remotely-located call center over the standard telephone connection thereby allowing the video image of the connection to be viewed at the remotely-located call center over the standard telephone connection.

4. An apparatus as in claim 3, further comprising:
    means for, when the transmitted video image as viewed at the call center indicates that the connection is improper, telephoning from the call center to the customer site to fix the improper connection.

5. An apparatus comprising:
    a remote analysis computer at a test site and communicating with a logic analyzer at the test site, the logic analyzer coupled to a device under test via a connection;
    a remotely-located call center communicating with the remote analysis computer over a standard telephone connection, thereby allowing analysis of the device under test from the call center via communications between the call center and the remote analysis computer over the standard telephone connection and communications between the remote analysis computer and the logic analyzer; and
    a video camera at the test site and directed on the connection, thereby producing a video image of the connection, the video camera communicating with the remote analysis computer to transmit the video image to the call center through the remote analysis computer over the standard telephone connection, thereby allowing the video image of the connection to be viewed at the call center over the standard telephone connection.

6. An apparatus as in claim 5, further comprising:
    a telephone located at the call center so that, when the transmitted video image as viewed at the call center indicates that the connection is improper, a call can be made to the test site to fix the improper connection.

7. An apparatus comprising:
a remote analysis computer located at a test site and communicating with a logic analyzer located at the test site, the logic analyzer coupled to a device under test via a connection, the remote analysis computer communicating with a remotely-located call center over a standard telephone connection and thereby allowing analysis of the device under test from the call center via communications between the call center and the remote analysis computer over the standard telephone connection and communications between the remote analysis computer and the logic analyzer;
a camera port connecting a video camera to the remote analysis computer, the video camera directed on the connection and thereby producing a video image of the connection, the video camera communicating with the remote analysis computer through the camera port to transmit the video image to the call center through the remote analysis computer over the standard telephone connection, thereby allowing the video image of the connection to be viewed at the call center over the standard telephone connection.

8. An apparatus as in claim 7, further comprising:
a telephone located at the call center so that, when the transmitted video image as viewed at the call center indicates that the connection is improper, a call can be made to the test site to fix the improper connection.

9. An apparatus as in claim 7, further comprising:
means for, when the transmitted video image as viewed at the call center indicates that the connection is improper, making call from the call center to the test site to fix the improper connection.

10. An apparatus comprising:
a logic analyzer coupled to a device under test at a test location via a connection; and
a video camera directed on the connection and thereby producing a video image of the connection, the video image being transmitted over a standard telephone connection to a call center located remote from the test location, thereby allowing the video image of the connection to be viewed at the call center over the standard telephone connection.

11. An apparatus as in claim 10, wherein the logic analyzer is controlled by the call center over the standard telephone connection to test the device under test.

12. An apparatus comprising:
a computer at a test site and communicating with a logic analyzer at the test site, the logic analyzer coupled to a device under test via a connection;
a remotely-located call center communicating with the computer over a standard telephone connection and thereby allowing analysis of the device under test from the call center via communications between the call center and the computer over the standard telephone connection and communications between the computer and the logic analyzer; and
a video camera at the test site and directed on the connection and thereby producing a video image of the connection, wherein the video image is transmitted to the call center over the standard telephone connection, thereby allowing the video image of the connection to be viewed at the call center over the standard telephone connection.

13. An apparatus as in claim 12, further comprising:
means for transmitting the video image to the call center to thereby allow the video image of the connection to be viewed at the call center.

* * * * *